(12) United States Patent
Aliahmad et al.

(10) Patent No.: US 7,279,937 B2
(45) Date of Patent: Oct. 9, 2007

(54) PROGRAMMABLE AMPLITUDE LINE DRIVER

(75) Inventors: Mehran Aliahmad, Ottawa (CA); Russ Brown, Ottawa (CA); Ivan Chan, Kanata (CA); Kristopher Kshonze, Ottawa (CA)

(73) Assignee: LSI Corporation, Milpitas, CA (US)

( * ) Notice: Subject to any disclaimer, the term of this patent is extended or adjusted under 35 U.S.C. 154(b) by 73 days.

(21) Appl. No.: 11/339,008

(22) Filed: Jan. 25, 2006

(65) Prior Publication Data

US 2007/0182615 A1    Aug. 9, 2007

(51) Int. Cl.
*H03K 19/094* (2006.01)
*H03K 19/0175* (2006.01)

(52) U.S. Cl. .................. 326/115; 326/68; 326/83; 327/109; 327/333

(58) Field of Classification Search ............ 326/30–31, 326/34, 68, 80, 83, 86–87; 327/108–109, 327/333
See application file for complete search history.

(56) References Cited

U.S. PATENT DOCUMENTS

| | | | | |
|---|---|---|---|---|
| 5,585,754 A | * | 12/1996 | Yamashina et al. | 327/158 |
| 6,670,828 B2 | * | 12/2003 | Ramaswamy | 326/83 |
| 6,954,110 B2 | * | 10/2005 | Li | 331/57 |
| 7,034,606 B2 | * | 4/2006 | Caresosa et al. | 327/563 |
| 7,042,271 B2 | * | 5/2006 | Chung et al. | 327/341 |
| 7,061,273 B2 | * | 6/2006 | Wang et al. | 326/86 |
| 2002/0113638 A1 | * | 8/2002 | Takauchi et al. | 327/333 |
| 2003/0085736 A1 | * | 5/2003 | Tinsley et al. | 326/81 |
| 2004/0155680 A1 | * | 8/2004 | Icking et al. | 326/83 |
| 2004/0246026 A1 | * | 12/2004 | Wang et al. | 326/86 |
| 2005/0024142 A1 | * | 2/2005 | Sowlati | 330/254 |
| 2005/0248382 A1 | * | 11/2005 | Chung et al. | 327/362 |
| 2005/0248396 A1 | * | 11/2005 | Caresosa et al. | 327/563 |
| 2007/0096797 A1 | * | 5/2007 | Camara et al. | 327/540 |

* cited by examiner

*Primary Examiner*—Vibol Tan
*Assistant Examiner*—Jason Crawford

(57) ABSTRACT

Embodiments of the invention include an integrated circuit including a line driver. The integrated circuit includes a voltage mode driver comprising complementary first and second input voltage drivers, a programmable resistor network and a current mode driver. The programmable resistor network allows the amplitude of the line driver outputs to be controlled based on the particular resistor connections in the programmable resistor network. Also, the differential impedance of the integrated circuit and the common mode impedance of the integrated circuit are based on the resistance values of the resistors in the programmable resistor network.

14 Claims, 3 Drawing Sheets

PROGRAMMABLE AMPLITUDE LINE DRIVER

BACKGROUND OF THE INVENTION

1. Field of the Invention

The invention relates to line drivers and line driver circuits. More particularly, the invention relates to programmable amplitude line drivers.

2. Description of the Related Art

A line driver is an amplifier or amplifier circuit that provides and transmits proper signals onto transmission lines. Line drivers extend the useful transmission distance between terminals or stations within a network by controlling the amplitude of the transmitted signals.

High speed data transmitters and other comparable devices generally need a relatively efficient line driver to provide sufficient signal amplitude at the output with sufficiently minimal internal power consumption, in accordance with applicable industry standards. For example, for data transmitters operating at rates of multi-gigabits-per-second, the line driver should provide a relatively wide range of amplitude (e.g., more than 1.5 volts peak-to-peak) at the transmitter output while satisfying other constraints. Such constraints include a relatively well-defined differential and common-mode impedance, a reduced impedance discontinuity during transitions, a relatively well controlled rise and fall time, a relatively well-defined common-mode voltage during all phases of operation, and a reduced skew and asymmetry between differential outputs.

Conventional line drivers typically have one of two configurations: an H-Bridge configuration or a Current Mode Logic (CML) configuration. The H-Bridge configuration includes a quad switch design with amplitude control provided by the tail currents. However, the H-Bridge configuration generally has a relatively undefined common-mode impedance, suffers from differential impedance drops during transitions, and has a timing mismatch due to positive-channel metal-oxide semiconductor (PMOS) and negative-channel metal-oxide semiconductor (NMOS) switches that cause common-mode voltage bounce. Also, the H-Bridge configuration generally needs a relatively large voltage to support current sources and the particular switch arrangement. Furthermore, the H-Bridge configuration has a relatively undefined common mode, which generally can be solved by additional circuitry.

The CML driver includes a dual switch arrangement with amplitude control provided through the tail current. However, the CML driver typically needs a relatively large amount of power, and has an asymmetric rise/fall time.

Accordingly, it would be desirable to have available an improved line driver, for use in high speed data transmitters and other devices, that reduces if not eliminates the previously-mentioned issues associated with conventional line driver configurations.

SUMMARY OF THE INVENTION

The invention is embodied in an integrated circuit including a line driver. The integrated circuit includes a voltage mode driver comprising complementary first and second input voltage drivers, a programmable resistor network and a current mode driver. The programmable resistor network allows the amplitude of the line driver outputs to be controlled based on the particular resistor connections in the programmable resistor network. Also, the differential impedance of the integrated circuit and the common mode impedance of the integrated circuit are based on the resistance values of the resistors in the programmable resistor network.

DETAILED DESCRIPTION OF EXEMPLARY EMBODIMENTS

Figure 1:
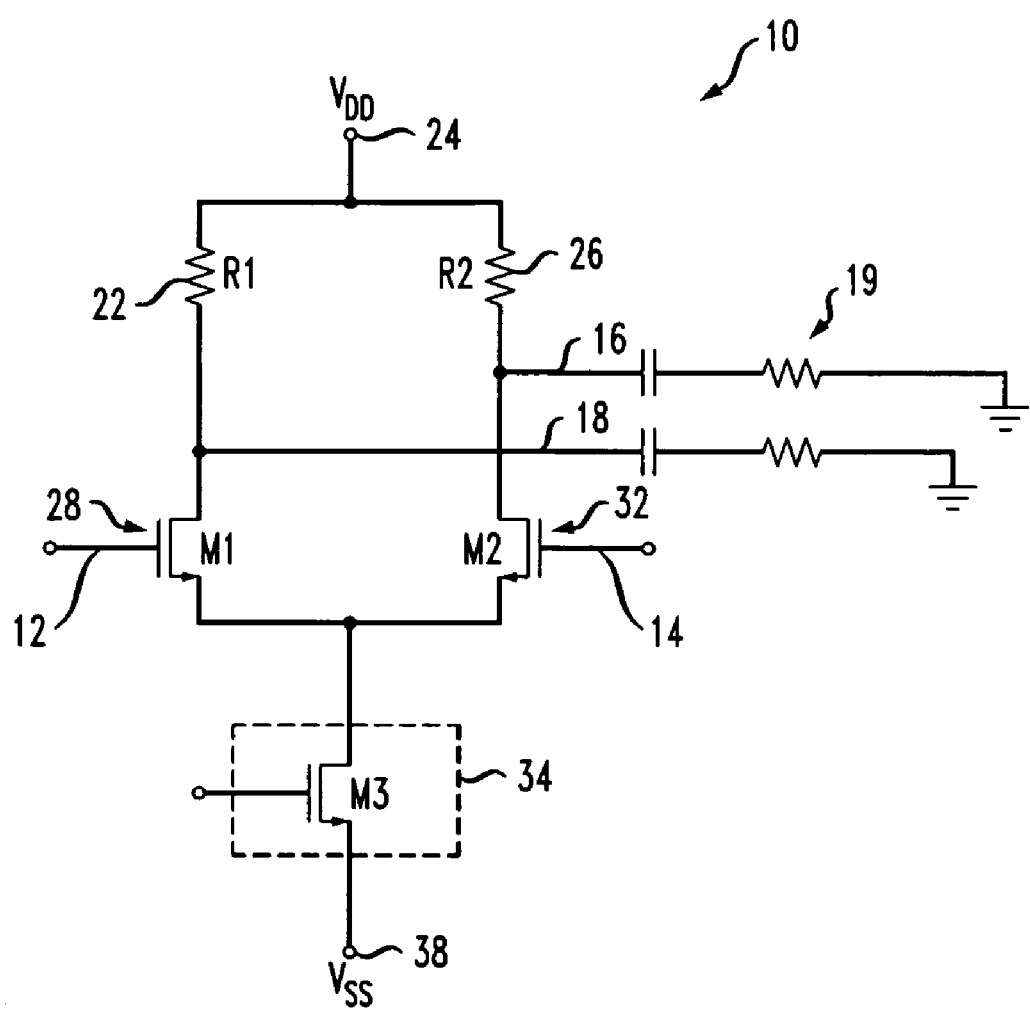
FIG. 1 is a simplified schematic diagram of a conventional current mode logic (CML) line driver.

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

Referring now to FIG. 1, shown is a simplified schematic diagram of a conventional current mode logic (CML) line driver 10. The conventional CML line driver 10 includes a first input or input line 12 and a second input or input line 14, which are complementary to one another. The CML line driver 10 also includes a first output or output line 16, a second output or output line 18, and a corresponding external termination network (shown generally as 19). The conventional CML line driver 10 also includes a first resistor ($R_1$) 22 coupled between an upper logic supply voltage ($V_{DD}$) 24 and the second output 18 and a second resistor ($R_2$) 26 coupled between the upper logic supply voltage ($V_{DD}$) 24 and the first output 16.

The conventional CML line driver 10 also includes a first field effect transistor (FET) device ($M_1$) 28 whose gate-drain junction is coupled between the first input 12 and the second output 18 and a second FET device ($M_2$) 32 whose gate-drain junction is coupled between the second input 14 and the first output 16. A current mode section 34, such as a third FET device ($M_3$) 36, is coupled between the gate-source junctions of the first and second FET devices 28, 32 and a lower logic supply voltage ($V_{SS}$) 38.

As discussed hereinabove, conventional current mode logic (CML) line drivers, such as the line driver 10, provide amplitude control through the tail current, i.e., current at the current mode section 34. However, conventional CML line drivers often have a relatively asymmetric rise/fall time, which is caused by the capacitance at the node joining the first FET device 28, the second FET device 32 and the third FET device 34. The capacitance at this node makes the output falling edge slew faster than the rising edge.

Moreover, conventional CML line drivers typically require a relatively large amount of power. For example, for impedance matching requirements, the first resistor ($R_1$) 22 and the second resistor ($R_2$) 26 are equal to the external load resistors. Thus, half of the power in the CML line driver 10 is dissipated or consumed at the first and second resistors 22, 26. Also, since the output voltage of the CML line driver 10 is limited by the upper logic supply voltage ($V_{DD}$) 24, if the CML line driver 10 needs to drive a higher output voltage, the upper logic supply voltage ($V_{DD}$) 24 must be increased, which thus increases power consumption.

In general, with line drivers, there are different amplitude requirements for different interface standards. For example, according to the standard known as Serial ATA (SATA or S-ATA), the transmission amplitude needs to be within the range of approximately 0.4 to 1.0 volts (V). According to the Serial Attached SCSI (SAS) standard, the transmission amplitude range is 1.0 to 1.6 V. Inherently, a line driver with a greater transmission amplitude range (i.e., a high amplitude driver) consumes more power than a line driver with a lesser transmission amplitude range (i.e., a low amplitude driver). If a high amplitude driver is used to drive low amplitude signals, the power consumption of the driver would be much greater than using a low amplitude driver.

However, line drivers according to embodiments of the invention can provide output amplitudes characteristic of both types of drivers, thus meeting the requirements of both the SATA and SAS standards. Yet, line drivers according to embodiments of the invention do not suffer the power consumption penalty conventionally associated with high amplitude drivers driving low amplitude output signals. Accordingly, line driver according to embodiments of the invention consume much less power than conventional line drivers.

Figure 2:
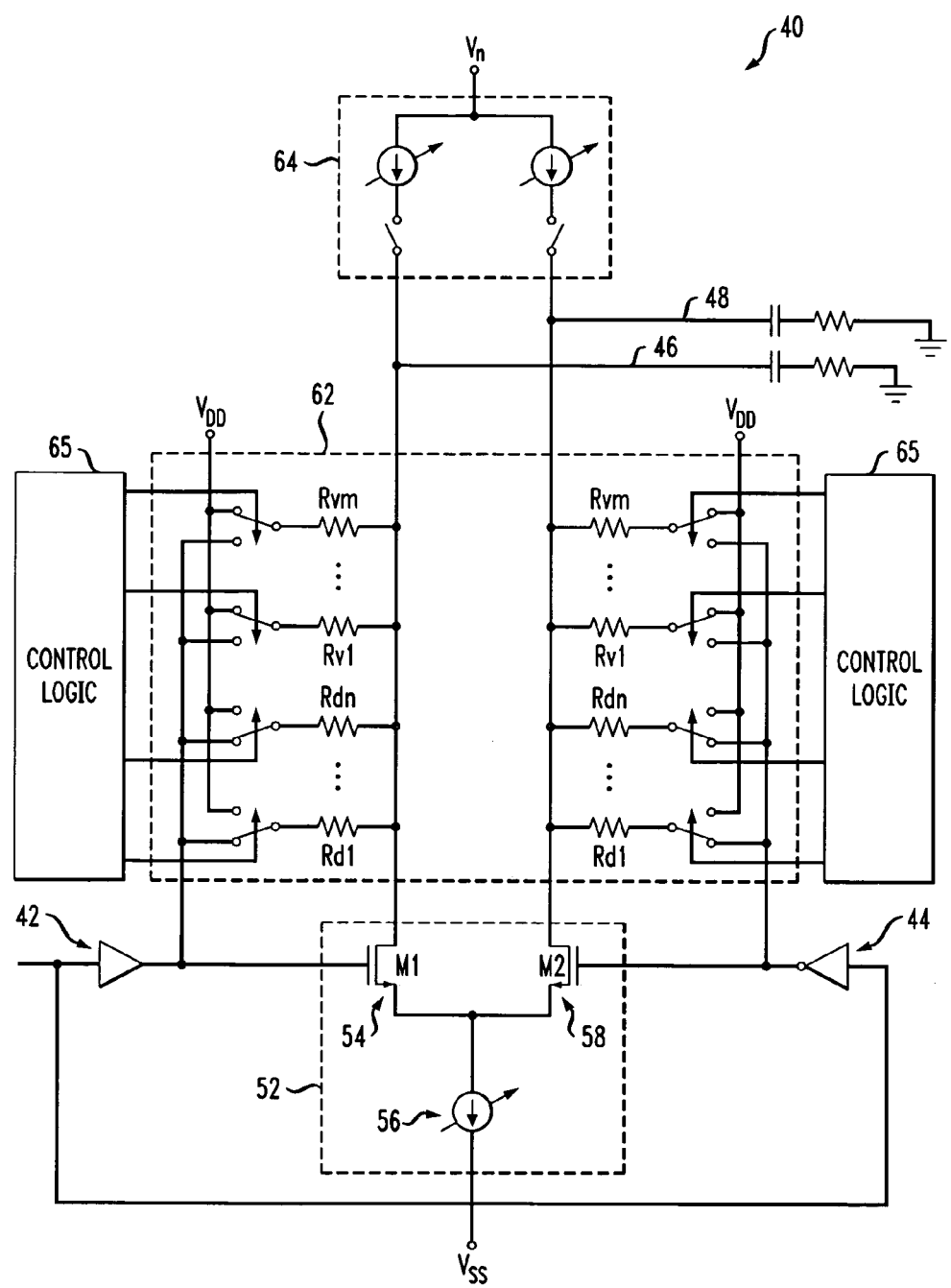
FIG. 2 is a simplified schematic diagram of a line driver according to embodiments of the invention.

Referring now to FIG. 2, shown is a simplified schematic diagram of a line driver 40 according to embodiments of the invention. In general, the line driver 40 is a differential driver that drives a complementary signal across a differential pair of output lines. The line driver 40 includes a voltage mode driver comprising a first input voltage driver 42 and a second input voltage driver 44. The line driver 40 also includes a first output or output line 46, a second output or output line 48, and a current mode driver or arrangement (shown generally as 52). The first input voltage driver 42 is a buffer or other suitable device. The second input voltage driver 44 is an inverter or other suitable device. The current mode arrangement 52 includes a first field effect transistor (FET) device ($M_1$) 54 coupled to the output of the first input voltage driver 42, a second field effect transistor (FET) device ($M_2$) 58 coupled to the output of the second input voltage driver 44, and a variable current source 56 coupled between the first FET device ($M_1$) 54 and a lower logic supply voltage $V_{SS}$.

According to embodiments of the invention, the line driver 40 also includes a programmable resistor network or arrangement (shown generally as 62) and a common mode voltage lifting section or arrangement (shown generally as 64). The programmable resistor network 62 is coupled generally between the first input voltage driver 42, the second input voltage driver 44, the first output 46 and the second output 48. The voltage lifting arrangement 64 is switchably coupled to the first output 46 and the second output 48.

The programmable resistor network 62 includes a first switchable array of resistors generally coupled between the first input voltage driver 42 and the first output 46, and a second switchable array of resistors generally coupled between the second input voltage driver 44 and the second output 48. The first array of resistors switchably couples one end of one or more of its resistors to either the output of the first input voltage driver 42 or an upper logic supply voltage $V_{DD}$ of the line driver 40. The other end of its plurality of resistors is coupled to the first output 46. The second array of resistors switchably couples one end of one or more of its resistors to either the output of the second input voltage driver 44 or the upper logic supply voltage $V_{DD}$ of the line driver 40. The other end of its plurality of resistors is coupled to the second output 48. The resistors in the programmable resistor network 62 are controlled by appropriate control logic 65.

In the configuration of the line driver 40, the impedance of the line driver 40 measured at the outputs 46 and 48 is the parallel sum of all the resistors in the programmable resistor network 62, i.e., the parallel combination of all the resistors in the first array of resistors and the parallel combination of all the resistors in the first array of resistors. This assumes that the upper logic supply voltage $V_{DD}$ and the output impedance of the voltage mode driver (i.e., the first and second input voltage drivers 42, 44) is very small compared to the resistance of the resistor arrays.

In the configuration of the line driver 40, the differential impedance, $Z_{diff}$, of the line driver 40 is the parallel combination of all the resistors in the programmable resistor network 62, i.e., 2×(m resistors+n resistors). That is, for k resistors (the sum of all the resistors in the first array of resistors, i.e., m+n resistors, and all the resistors in the second array of resistors, i.e., m+n resistors), the differential impedance, $Z_{diff}$, of the line driver 40 is:

$$Z_{diff} = \frac{1}{\frac{1}{R1} + \frac{1}{R2} + \ldots + \frac{1}{Rk}}$$

Differential impedance is the impedance seen when testing between a pair of lines that are driven by equal and opposite polarity signals, e.g., the first and second input voltage drivers 42, 44.

In the configuration of the line driver 40, the common mode impedance, $Z_{com}$, of the line driver 40 is the parallel combination of all the resistors in the programmable resistor network 62 divided by 2. That is, for k resistors, the common mode impedance, $Z_{com}$, of the line driver 40 is:

$$Z_{com} = \left[\frac{1}{\frac{1}{R1} + \frac{1}{R2} + \ldots + \frac{1}{Rk}}\right]\Big/2$$

Common mode impedance is the impedance seen when testing between a pair of lines driven by identical (common) signals.

In the configuration of the line driver 40, if all k resistors have approximately the same resistance value, R, then the differential impedance, $Z_{diff}$, of the line driver 40 is 2R/k and the common mode impedance, $Z_{com}$, of the line driver 40 is R/(2k).

In operation, the output amplitude of the line driver 40 at the first and second outputs 46, 48 is dependent on the connections of the resistors in the programmable resistor network 62. In this manner, the programmable resistor network 62 is used for programming the output amplitude at the first output 46 and the second output 48.

Each of the first and second switchable array of resistors can be divided into two resistor banks: a first bank of those resistors that are coupled to the voltage mode driver and a second bank of those resistors that are coupled to the upper logic supply voltage $V_{DD}$. The total resistance of each resistor bank is the parallel combination of all the resistors in that particular bank. Thus, the total resistance of the first resistor bank ($R_v$) is the parallel combination of all the resistors that are coupled to the voltage mode driver. Similarly, the total resistance of the second resistor bank ($R_d$) is the parallel combination of all the resistors that are coupled to upper logic supply voltage $V_{DD}$.

The output amplitude of the line driver 40 at the first and second outputs 46, 48 is:

$$A_{out} = \frac{V_{DD}}{R_d + R_v} R_d$$

where $V_{DD}$ is the upper logic supply voltage, $R_d$ is the overall resistance of the second resistor bank, i.e., the overall resistance of all the resistors coupled to the upper logic supply voltage $V_{DD}$, and $R_v$ is the overall resistance of the first resistor bank, i.e., the overall resistance of all the resistors coupled to the voltage mode driver.

If all the resistors have approximately the same resistance value, then the output amplitude of the line driver 40 is:

$$A_{out} = \frac{V_{DD}}{m+n} m$$

where $V_{DD}$ is the upper logic supply voltage, n is the total number of resistors coupled to the voltage mode driver and m is the total number of resistors coupled to the upper logic supply voltage $V_{DD}$.

Therefore, the output amplitude of the line driver 40 at the first and second outputs 46, 48 can be determined, or set or established by programming a particular number of resistors in the programmable resistor network 62 to be coupled to the voltage mode driver and the remaining resistors to be coupled to the upper logic supply voltage $V_{DD}$. The relatively high impedance of the current mode arrangement 52 allows it essentially to be ignored in determining the output impedance of the line driver 40 at the first and second outputs 46, 48.

However, the current mode arrangement 52 can be used for fine tuning the output amplitude of the line driver 40 if the programmable resistor network 62 does not provide adequate amplitude resolution. Also, the current mode arrangement 52 can be used for amplitude boosting for transmitter signal equalization. Also, the current mode arrangement 52 can be used for compensating for changes in amplitude due to power supply variations.

As shown in the schematic diagram of FIG. 2, the resistors in the programmable resistor network 62 are coupled to either the voltage mode driver or the upper logic supply voltage via a corresponding plurality of switches. However, the programmable resistor network 62 can include other suitable arrangements.

Figure 3:
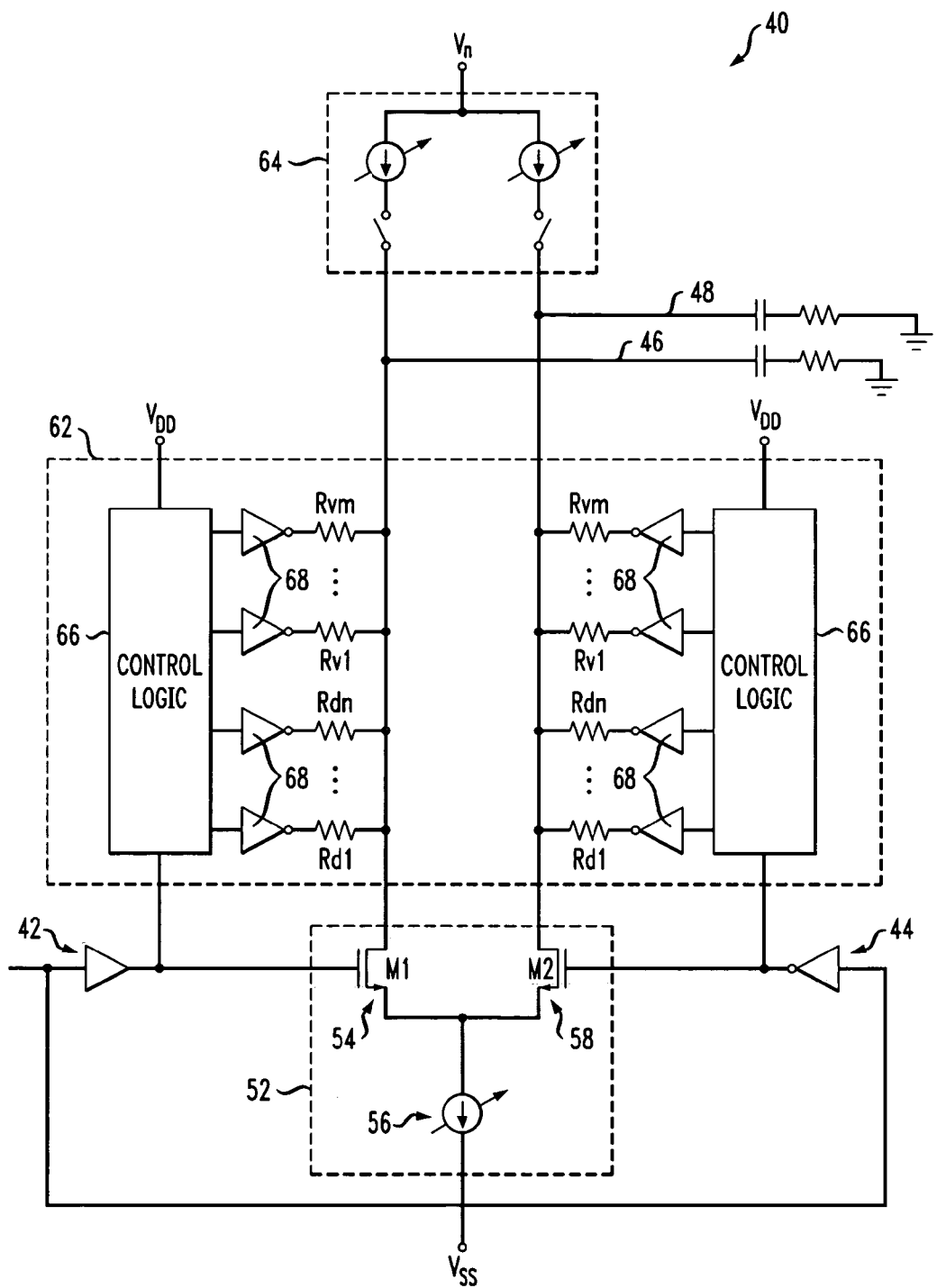
FIG. 3 is another simplified schematic diagram of a line driver according to embodiments of the invention.

Referring now to FIG. 3, shown is another schematic diagram of the line driver 40 according to embodiments of the invention. In the embodiment of the invention shown in FIG. 3, each array of resistors in the programmable resistor network 62 includes control logic 66 and a plurality of inverters 68 that correspond to the plurality of resistors in each resistor array. The control logic 66 also is coupled to the output of the voltage mode driver (i.e., input voltage drivers 42, 44) and coupled to the upper logic supply voltage $V_{DD}$. The control logic 66 provides suitable input values to the inverters 68 in such a manner that the resistors effectively are either tied to or coupled to the voltage mode driver or the upper logic supply voltage $V_{DD}$.

Referring again to FIG. 2, with continuing reference to FIG. 3, in the embodiments of the invention shown in both FIG. 2 and FIG. 3, the common mode voltage lifting arrangement 64 is used to shift the common mode voltage level higher or lower depending on whether the output amplitude level of the line driver 40 at the first and second outputs 46, 48 is relatively high or low. If the output amplitude level is relatively high, the logic low or "0" signal at the first and second outputs 46, 48 will swing relatively low. Such behavior will limit the supply head room for the current mode driver 52, thus causing the line driver to operate in an abnormal manner.

Therefore, the common mode voltage lifting arrangement 64 is used generally to add or inject direct current (DC current) from a supply voltage $V_h$, which is greater than the upper logic supply voltage $V_{DD}$. The DC current from the supply voltage $V_h$ increases or raises the output levels of both the first and second outputs 46, 48. If the output amplitude of the line driver 40 is relatively small and thus no current is drawn from the upper logic supply voltage $V_{DD}$, the DC current supplied by the common mode voltage lifting arrangement 64 is not needed. Therefore, in general, the common mode voltage lifting arrangement 64 saves power in the line driver 40 at relatively low output amplitude settings.

Compared to conventional line drivers, the line driver 40 according to embodiments of the invention has a number of advantages. For example, in the line driver 40, because the differential impedance and the common mode impedance are defined by resistor values, these impedances are relatively well controlled during all stages of operation of the line driver 40. Also, with the programmable resistor network 62, the output amplitude of the line driver 40 is relatively easy to program. Also, during operation of the line driver 40, the common mode voltage is relatively well defined without the need for additional common mode circuitry. Also, the line driver 40 has a relatively low voltage requirement, e.g., high speed logic in the line driver 40 can operate below 1.2 volts. Also, line driver 40 has relatively low power consumption and relatively symmetric rise/fall times.

It will be apparent to those skilled in the art that many changes and substitutions can be made to the embodiments of the invention herein described without departing from the spirit and scope of the invention as defined by the appended claims and their full scope of equivalents. For example, although the circuit components are described hereinabove as an integrated circuit or part of an integrated circuit, the various circuit components alternatively can be discrete components arranged and coupled together to form the various circuits shown and described.

The invention claimed is:

1. An integrated circuit including a line driver circuit, comprising:

a first input voltage driver having an output;

a second input voltage driver having an output and coupled to and complementary with the first input voltage driver;

a programmable resistor network coupled between the output of the first input voltage driver, the output of the second input voltage driver, a first output, and a second output; and a current mode arrangement coupled between the first input voltage driver, the second input voltage driver, and the programmable resistor network, wherein the differential impedance of the integrated circuit is based on the resistance of the programmable resistor network, wherein the common mode impedance of the integrated circuit is based on the resistance of the programmable resistor network, and wherein the programmable resistor network controls the output amplitude of the integrated circuit at the first output and at the second output.

2. The integrated circuit as recited in claim 1, wherein the programmable resistor network further comprises a first switchable array of resistors coupled between the first input voltage driver and the first output, and a second switchable array of resistors coupled between the second input voltage driver and the second output.

3. The integrated circuit as recited in claim 1, wherein the programmable resistor network further comprises a first switchable array of resistors having first ends coupled to the first output and second ends switchably coupled to either an output of the first input voltage driver or a logic supply voltage of the line driver circuit.

4. The integrated circuit as recited in claim 3, wherein the output amplitude of the first output is based on the number of resistors in the programmable resistor network that is coupled between the output of the first input voltage driver and the first output and the number of resistors in the programmable resistor network that is coupled between the output of the first input voltage driver and the logic supply voltage of the line driver circuit.

5. The integrated circuit as recited in claim 1, wherein the programmable resistor network further comprises a second switchable array of resistors having first ends coupled to the second output and second ends switchably coupled to either an output of the second input voltage driver or a logic supply voltage of the line driver circuit.

6. The integrated circuit as recited in claim 5, wherein the output amplitude of the second output is based on the number of resistors in the programmable resistor network that is coupled between the output of the second input voltage driver and the second output and the number of resistors in the programmable resistor network that is coupled between the output of the second input voltage driver and the logic supply voltage of the line driver circuit.

7. The integrated circuit as recited in claim 1, further comprising control logic coupled to the programmable resistor network for controlling the resistance of the programmable resistor network.

8. The integrated circuit as recited in claim 1, further comprising a common mode voltage lifting circuit arrangement coupled to the first output and the second output.

9. The integrated circuit as recited in claim 8, wherein the common mode voltage lifting circuit arrangement includes a first variable current source switchably coupled to the first output and a second variable current source switchably coupled to the second output.

10. The integrated circuit as recited in claim 1, wherein the programmable resistor network is configured in such a way that, if the programmable resistor network has a plurality k of resistors each having a resistance approximately equal to R, the differential impedance of the integrated circuit is approximately $2R/k$.

11. The integrated circuit as recited in claim 1, wherein the programmable resistor network is configured in such a way that, if the programmable resistor network has a plurality k of resistors each having a resistance approximately equal to R, the common mode impedance of the integrated circuit is approximately $R/(2k)$.

12. The integrated circuit as recited in claim 1, wherein the current mode arrangement includes a variable current source coupled between the first voltage driver and the programmable resistor network.

13. The integrated circuit as recited in claim 1, wherein the first input voltage driver further comprises a buffer.

14. The integrated circuit as recited in claim 1, wherein the second input voltage driver further comprises an inverter.

* * * * *